(12) United States Patent
Okada et al.

(10) Patent No.: US 7,679,871 B2
(45) Date of Patent: Mar. 16, 2010

(54) SEMICONDUCTOR DEVICE AND METHOD FOR DETERMINING FUSE STATE

(75) Inventors: Norio Okada, Kanagawa (JP); Takehiro Ueda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 255 days.

(21) Appl. No.: 11/806,553

(22) Filed: Jun. 1, 2007

(65) Prior Publication Data

US 2007/0278617 A1 Dec. 6, 2007

(30) Foreign Application Priority Data

Jun. 6, 2006 (JP) ............................. 2006-157604

(51) Int. Cl.
*H01L 29/00* (2006.01)
(52) U.S. Cl. ......................................... 361/56; 257/529
(58) Field of Classification Search .................. 361/56, 361/111; 257/530, 529
See application file for complete search history.

(56) References Cited

U.S. PATENT DOCUMENTS 6,035,430 A * 3/2000 Taniguchi .................... 714/724
6,163,488 A * 12/2000 Tanizaki et al. ............. 365/200
6,903,437 B1 * 6/2005 Manning ..................... 257/530

FOREIGN PATENT DOCUMENTS

| JP | 2000-31283 | 1/2000 |
| JP | 2001-210093 | 8/2001 |
| JP | 2004-103610 | 4/2004 |
| JP | 2004-265523 | 9/2004 |
| JP | 2004-342729 | 12/2004 |
| JP | 2005-57186 | 3/2005 |

* cited by examiner

*Primary Examiner*—Danny Nguyen
(74) *Attorney, Agent, or Firm*—Young & Thompson (57) ABSTRACT

A semiconductor device includes a semiconductor substrate, a fuse which comprises a conductive material and is formed on a semiconductor substrate, a contacting target conductor region which is placed around the fuse on the semiconductor substrate and formed so as to make electrical contact with the fuse through the conductive material constituting the fuse when a process for cutting the fuse is carried out, and a determination unit which detects whether or not the fuse is electrically disconnected, and detects whether or not the contacting target conductor region and the fuse are electrically connected, and determines that the fuse is in a cut state when electrical disconnection of said fuse is detected or electrical connection between said contacting target conductor region and said fuse is detected.

10 Claims, 10 Drawing Sheets

SEMICONDUCTOR DEVICE AND METHOD FOR DETERMINING FUSE STATE

This application is based on Japanese Patent application NO. 2006-157604, the content of which is incorporated hereinto by reference.

BACKGROUND

1. Technical Field

The present invention relates to a semiconductor device and a method for determining a state of fuse, and particularly, relates to a semiconductor device including a fuse and a method for determining a state of fuse.

2. Related Art

Conventional technologies in which a fuse is mounted on a semiconductor device to adjust the value of a resistance used in the semiconductor device by cutting the fuse, or a defective element is separated and then it is replaced with a normal element, are known. Typical manner for cutting a fuse includes cutting a fuse by irradiating a laser beam to a portion of the fuse and cutting a fuse by applying an electric current.

Japanese Unexamined Patent Publication 2005-57186 describes an electric fuse which is cut by utilizing a phenomenon in which the material constituting the electric fuse migrates by an electromigration. Here, since a configuration where the portion of the electric fuse to be cut is enclosed by a plate, heat generated in the portion to be cut when a current flows through the fuse is trapped or accumulated. It is described that thus, cutting is accelerated.

Japanese Unexamined Patent Publication 2004-342729, Japanese Unexamined Patent Publication 2000-31283, Japanese Unexamined Patent Publication 2001-210093, Japanese Unexamined Patent Publication 2004-265523 and Japanese Unexamined Patent Publication 2004-103610 describe a technology for determining the state of cutting of such a fuse.

Japanese Unexamined Patent Publication 2004-342729 describes a determination circuit which determines the melt-cut state of a fuse on the basis of the difference between the reference resistance and the resistance of the fuse after melt-cut.

Japanese Unexamined Patent Publication 2000-31283 describes a circuit having an output inverter which monitors the state of a fuse and a switching transistor which initially melt-cuts a fuse and automatically re-fuses the fuse when re-growth of a filament is recognized after the initial melt-cut of the fuse.

Japanese Unexamined Patent Publication 2001-210093 describes a repair signal generating circuit which outputs a repair signal correctly detecting whether or not the fuse is cut, so that a circuit having a defective portion can be surely repaired.

Japanese Unexamined Patent Publication 2004-265523 describes a semiconductor device having such a configuration that the performance of the drive circuit in a latch circuit can be increased in comparison with a normal mode by switching mode signals. As a result, it is described that misrecognition of the disconnection of a fuse can be prevented.

Figure 10:
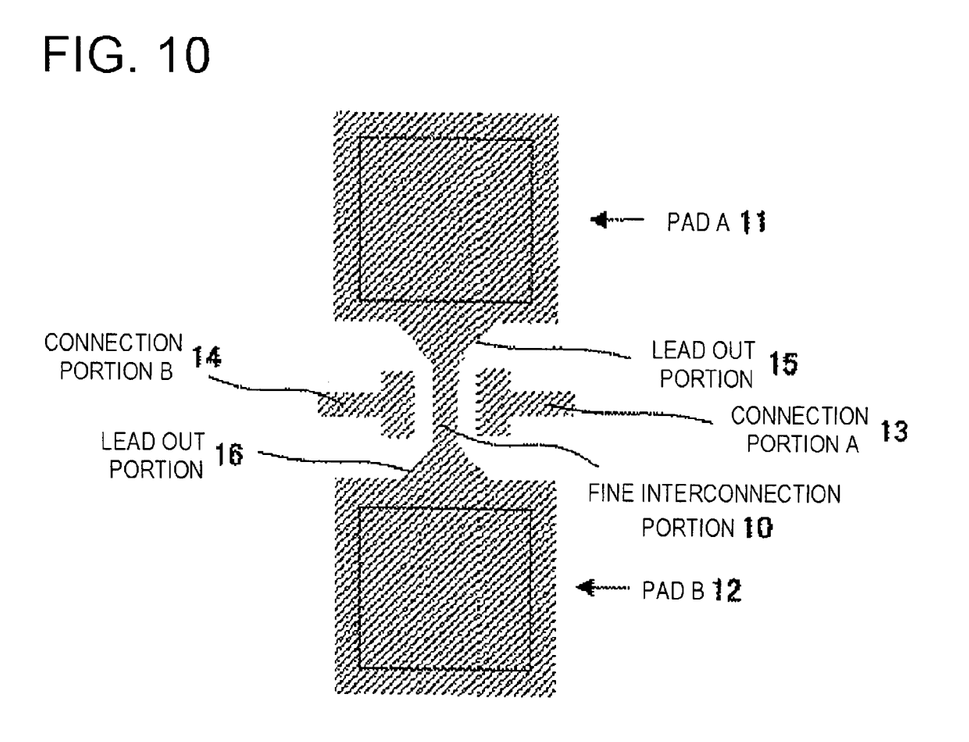
FIG. 10 is a schematic plan diagram showing a trimming pattern according to a conventional technology.

Japanese Unexamined Patent Publication 2004-103610 describes a trimming pattern (electric fuse) for adjustment which selects on or off of the connection of a circuit for adjustment that has been prepared in advance on a semiconductor integrated circuit. FIG. 10 is a schematic plan diagram showing a trimming pattern as described in Japanese Unexamined Patent Publication 2004-103610. The trimming pattern includes two pads 11 and 12 to which a voltage is applied, a fine interconnect 10 connecting the two pads 11 and 12, and two connections 13 and 14 which are located on each of both sides of the fine interconnect 10 without making contact with the fine interconnect 10 and connected to the circuit for adjustment and the semiconductor integrated circuit. With this trimming pattern, when a voltage is applied between the pads 11 and 12, a current flows through the fine interconnect 10 so that the fine interconnect 10 is melt to be connected to the connections 13 and 14. With this operation, an adjustment circuit connected to the connections 13 and 14 is turned on and thus trimming is carried out. In this case, the trimming is not carried out by having the fine interconnect 10 cut such that an adjustment circuit connected to the pads 11 and 12 is turned off. It is described that it is easier to make the melted metal contact to the connections 13 and 14, which are close by, than to melt-cut the fine interconnect 10. Thus, it is described that trimming can be easily carried out in a short period of time.

However, there is a problem with the conventional technology described in Japanese Unexamined Patent Publication 2005-57186, 2004-342729, 2000-31283, 2001-210093, and 2004-265523, in which the cut state of the fuse, which is supposed to be cut, cannot be correctly determined in cases where the fuse is not sufficiently cut, or where the material constituting the fuse migrates to cause reconnection after the fuse is once cut. In addition, the distance between interconnects becomes smaller as semiconductors are miniaturized. Therefore, the problem of short circuiting between interconnects has become significant.

Furthermore, there is also a problem with the technology described in Japanese Unexamined Patent Publication 2004-103610, in which the cut state of the fuse cannot be correctly determined in cases where the melted metal does not make contact with the connections 13 and 14 or where the material constituting the fuse migrates to cause re-cut after the contact is once made. In addition, in the configuration described in Japanese Unexamined Patent Publication 2004-103610, it is necessary to add a structure for applying a voltage between the pads 11 and 12, as well as two connections 13 and 14. Thus, there is another problem that the area increases.

SUMMARY

According to the present invention, there is provided a semiconductor device, including:

a semiconductor substrate;

a fuse which comprises a conductive material and is formed on the semiconductor substrate;

a contacting target conductor region which is placed around the fuse on the semiconductor substrate and formed so as to make electrical contact with the fuse through the conductive material constituting the fuse when a process for cutting the fuse is carried out; and a determination unit which detects whether or not the fuse is electrically disconnected, as well as whether or not the contacting target conductor region and the fuse are electrically connected, and determines that the fuse is in a cut state when electrical disconnection of the fuse is detected or electrical connection between the contacting target conductor region and the fuse is detected.

The present invention provides a method for determining a fuse state in a semiconductor device including a fuse which includes a conductive material and is formed on a semiconductor substrate and a contacting target conductor region which is placed around the fuse on the semiconductor substrate and formed so as to be electrically connected to the fuse through the conductive material constituting the fuse when a process for cutting the fuse is carried out, the method for determining a fuse state including:

detecting whether or not the fuse is electrically disconnected;

detecting whether or not the contacting target conductor region and the fuse are electrically connected; and determining that the fuse is in a cut state when electrical disconnection of said fuse is detected or electrical connection between the contacting target conductor region and the fuse is detected.

In this configuration, the accuracy of determination of the cut state of a fuse can be improved. In addition, when a process for cutting a fuse is carried out, the contacting target conductor region is electrically connected to the fuse in the configuration. When it is detected whether or not the contacting target conductor region and the fuse are electrically connected, it is necessary to ground either the contacting target conductor region or the fuse. In the configuration of the present invention, the fuse is grounded using an interconnect used to ground conventional fuses, and thus, it can be detected whether or not the contacting target conductor region and the fuse are electrically connected. Therefore, it is not necessary to additionally provide a specific interconnect for grounding, and the accuracy of determining the fuse state can be increased while preventing increase in the area of the device, which has a simple configuration.

The semiconductor device of the present invention may have a configuration where in the fuse, a cut portion is formed I@ between the one end side and a connect portion which is connected to the contacting target conductor region in a cut state.

The semiconductor device of the present invention may have a configuration where the fuse includes a flow-out portion composed of the conductive material which has flown out from the fuse to be connected with the contacting target conductor region and to form a cut portion between the flow-out portion and the first detection unit in a cut state The present inventors found a new technique for cutting a fuse. Here, the fuse may be an electric fuse which is cut by a current flow. By providing a certain configuration to an electric fuse and through control in accordance with a method for applying voltage, the conductor which is a part of the electric fuse and constitutes the electric fuse is forced to flow toward outside when the electric fuse is cut, and thus, the balance between migration and the supply of the material is lost thereby forming a larger cut portion in other part.

A portion of connection between the fuse and the contacting target conductor region and a cut portion where the fuse is cut can be selectively set. As a result, a configuration where the fuse is cut in a portion between one end side and the connect portion to which the contacting target conductor region connects in a cut state can be provided as described above. In addition, this technique allows the disconnection of the electric fuse in the cut state to be maintained in improved condition.

Here, "outside" means outside of the region where the fuse is formed in the state before being cut. For example, in the case where the fuse is formed of an interconnect, it can mean outside of the trench for the interconnect. Therefore, the conductive material constituting the fuse is sucked out in the direction toward the flow-out portion, and the fuse is cut in a portion different from the flow-out portion.

According to the present invention, the accuracy of determining a fuse state can be improved.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
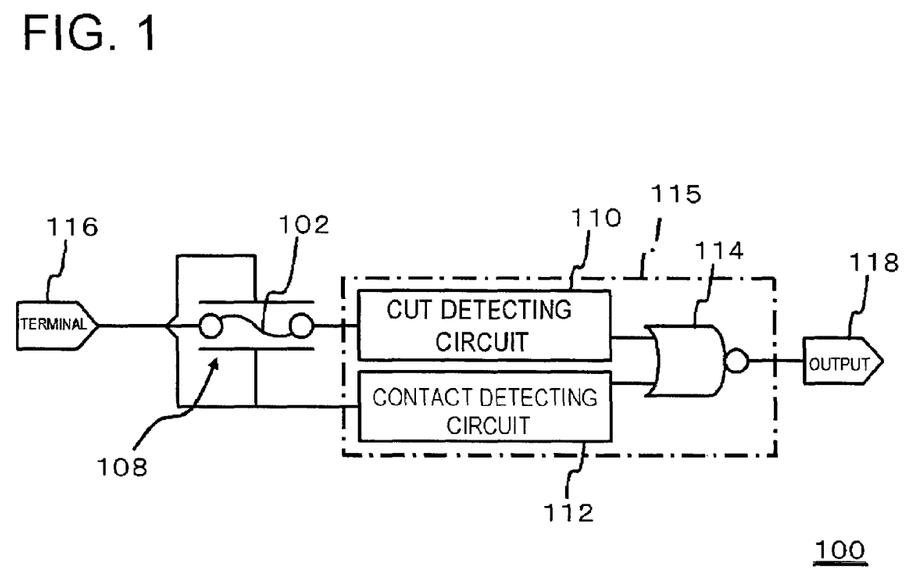
FIG. 1 is a schematic diagram showing a configuration of a semiconductor device according to an embodiment of the present invention.

FIG. 1 is a schematic diagram showing the configuration of the semiconductor device according to an embodiment of the present invention.

A semiconductor device 100 includes a semiconductor substrate (not shown), a fuse 102 which comprises a conductive material and is formed on the semiconductor substrate, and a contacting target conductor region 108 which is placed around the fuse 102 on the semiconductor substrate and formed so as to be electrically connected to the fuse 102 through the conductive material constituting the fuse 102 when a process for cutting the fuse 102 is carried out.

The semiconductor device 100 further includes a determination unit 115 which detects whether or not the fuse 102 is electrically disconnected, and in addition, detects whether or not the contacting target conductor region 108 and the fuse 102 are electrically connected, and thus, determines that the fuse 102 is in a cut state when electrical disconnection of the fuse 102 is detected, or electrical connection between the contacting target conductor region 108 and the fuse 102 is detected.

According to the present embodiment, the determination unit 115 includes a cut detecting circuit 110 (first detection unit), a contact detecting circuit 112 (second detection unit) and an NOR circuit 114 (output unit). The cut detecting circuit 110 is connected to one end of the fuse 102 and detects whether or not the fuse 102 is electrically disconnected. The contact detecting circuit 112 is connected to the contacting target conductor region 108 and detects whether or not the contacting target conductor region 108 and the fuse 102 are electrically connected. The NOR circuit 114, into which an output from the cut detecting circuit 110 and an output from the contact detecting circuit 112 are inputted, outputs a signal which indicates that the fuse 102 is in a cut state in the case where the electrical disconnection of the fuse 102 is detected by the cut detecting circuit 110, or in the case where the electrical connection between the contacting target conductor region 108 and the fuse 102 is detected by the contact detecting circuit 112. A first terminal 116 is connected to the other end of the fuse 102. The contacting target conductor region 108 is placed in the vicinity of the fuse 102 and connected to the contact detecting circuit 112. The output of the NOR circuit 114 is connected to a second terminal 118.

The cut detecting circuit 110 supplies a predetermined electric potential to the one end of the fuse 102 in a state where the other end of the fuse 102 (first terminal 116) is grounded and detects whether the electric potential at the one end is high or low. Thus, the cut detecting circuit 110 detects that the fuse 102 is electrically disconnected in the case where this electric potential is higher than the reference potential, and detects that the fuse 102 is not electrically disconnected in the case where this electric potential is lower than the reference potential. The cut detecting circuit 110 may determine that the potential is low in the case where, for example, the ground potential is detected and that the potential is high in the case where a potential which is approximately the same as that supplied to the one end of the fuse 102 is detected.

The contact detecting circuit 112 supplies a predetermined electric potential to the contacting target conductor region 108 in a state where the fuse 102 is grounded, and detects whether the electric potential of the contacting target conductor region 108 is high or low. Thus, the contact detecting circuit 112 detects that the contacting target conductor region 108 and the fuse 102 are not electrically connected in the case where this electric potential is higher than the reference potential, and detects that the contacting target conductor region 108 and the fuse 102 are electrically connected in the case where this electric potential is lower than the reference potential. The contact detecting circuit 112 may determine that the potential is low in the case where the ground potential is detected and that the potential is high in the case where a potential which is approximately the same as that supplied to the contacting target conductor region 108 is detected.

Figure 2:
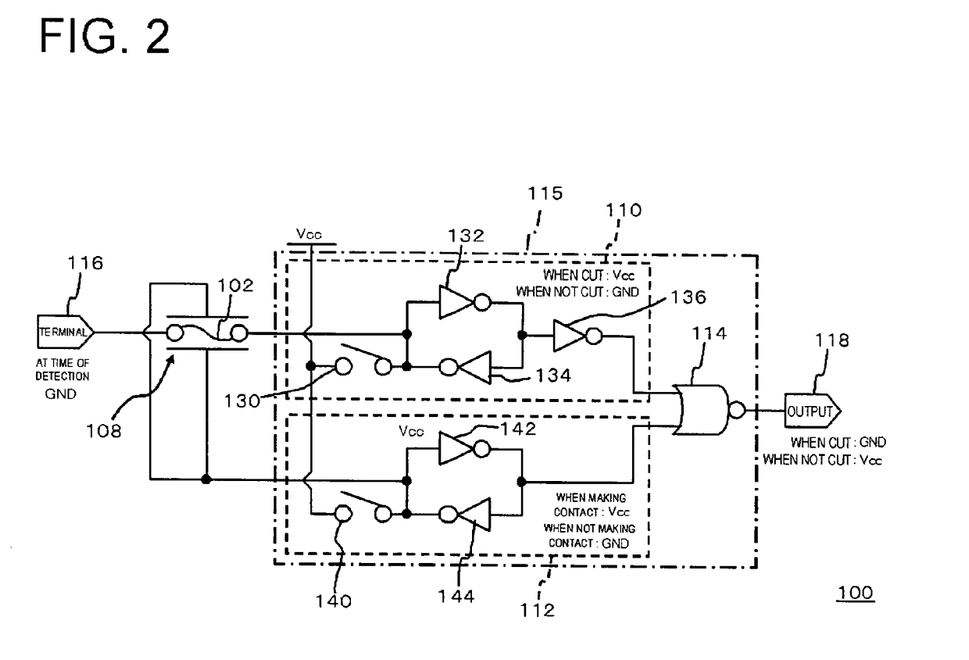
FIG. 2 is a schematic diagram showing a specific example of the configuration of a cut detecting circuit and a contact detecting circuit in the semiconductor device of FIG. 1.

FIG. 2 is a schematic diagram showing the configuration of a specific example of the cut detecting circuit 110 and the contact detecting circuit 112 in the semiconductor device 100 of FIG. 1.

The cut detecting circuit 110 includes a first switch 130, a first inverter 132, a second inverter 134 and a third inverter 136. The first inverter 132 and the second inverter 134 are connected so as to be in annular form where the output from one is inputted into the other, respectively, and function as a memory circuit. The fuse 102 and the first switch 130 are connected to the input of the first inverter 132. The first switch 130 turns on and off the connection between the power line Vcc and the first inverter 132. The output of the first inverter 132 is inputted into the third inverter 136. The output of the third inverter 136 is inputted into the NOR circuit 114.

The contact detecting circuit 112 includes a second switch 140, a fourth inverter 142 and a fifth inverter 144. The fourth inverter 142 and the fifth inverter 144 are connected so as to be in annular form where the output from one is inputted into the other, respectively, and function as a memory circuit. The contacting target conductor region 108 and the second switch 140 are connected to the input of the fourth inverter 142. The second switch 140 turns on and off the connection between the power line Vcc and the fourth inverter 142. The output of the fourth inverter 142 is inputted into the NOR circuit 114. The contact detecting circuit 112 may have the similar configuration as that used for determining whether or not an antifuse is electrically connected.

Figure 3:
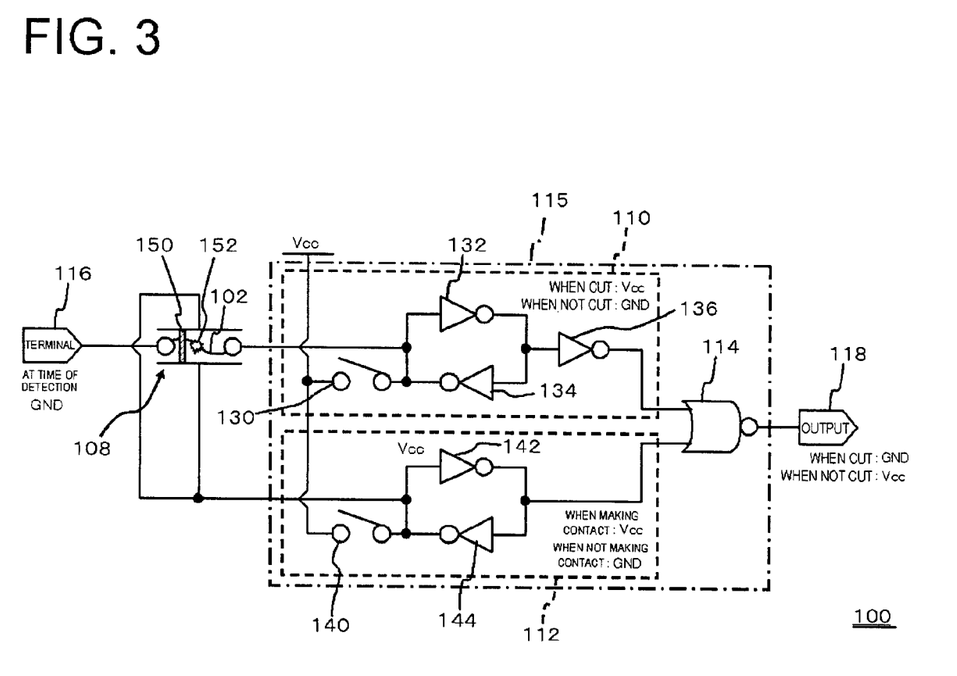
FIG. 3 is a diagram showing a state where a fuse according to an embodiment of the present invention is cut.

FIG. 3 shows the fuse 102 according to the present embodiment in a cut state. When the fuse 102 according to the present embodiment is in a cut state, a cut portion 152 (cut region) is formed between a contact portion (connection region) 150 with the contacting target conductor region 108 and the cut detecting circuit 110.

In this configuration, in the case where the first terminal 116 is grounded and a predetermined electric potential (Vcc) is supplied to the contacting target conductor region 108, the electric potential of the contacting target conductor region 108 varies depending on whether or not the contacting target conductor region 108 is electrically connected to the fuse 102. Therefore, the state of the electrical connection between the contacting target conductor region 108 and the fuse 102 can be detected by the contact detecting circuit 112. In this case, the electric potential of the contacting target conductor region 108 becomes GND when the contacting target conductor region 108 is connected to the fuse 102 via the contact portion 150. Meanwhile, the electric potential of the contacting target conductor region 108 becomes Vcc when the contacting target conductor region 108 is not electrically connected to the fuse 102.

Next, the process procedure for determining whether the fuse 102 is in a cut state or not in the semiconductor device 100 having the above described configuration is specifically described. First, the detection process by the cut detecting circuit 110 is described.

The first switch 130 is turned on so that the first inverter 132 and the power line Vcc are connected. As a result, a predetermined electric potential (Vcc) is supplied to one end of the fuse 102. In addition, the first terminal 116 is grounded (GND). Then, the first switch 130 is turned off after a predetermined time has passed.

In the case where the fuse 102 is not electrically disconnected in the above described state, a current flows through the fuse 102, and therefore, the potential at the one end of the fuse 102 becomes GND (low potential). Therefore, the input into the first inverter 132 becomes GND (low potential) and the input into the third inverter 136 becomes Vcc. At this time, GND is inputted from the third inverter 136 into the NOR circuit 114. Meanwhile, in the case where the fuse 102 is electrically connected, no current flows through the fuse 102, and therefore, the potential at the one end of the fuse 102 is maintained at Vcc (high potential). Therefore, the input into the first inverter 132 becomes Vcc (high potential) and the input into the third inverter 136 becomes GND. At this time, Vcc is inputted from the third inverter 136 into the NOR circuit 114.

Next, the detection process by the contact detecting circuit 112 is described.

The second switch 140 is turned on so that the fourth inverter 142 and the power line Vcc are connected. As a result, a predetermined electric potential (Vcc) is supplied to the contacting target conductor region 108. In addition, the first terminal 116 is grounded (GND). Then, the second switch 140 is turned off after a predetermined time has passed.

In the case where the contacting target conductor region 108 is electrically connected to the fuse 102, that is, in the case where a process for electrically disconnecting the fuse 102 is carried out, in the above described state, the contacting target conductor region 108 is electrically connected to the fuse 102 via the contact portion 150, and therefore, the electric potential of the contacting target conductor region 108 becomes GND (low potential). Therefore, the input into the fourth inverter 142 becomes GND (low potential), and Vcc is inputted from the fourth inverter 142 into the NOR circuit 114. Meanwhile, in the case where the contacting target conductor region 108 is not electrically connected, that is, in the case where a process for electrically disconnecting the fuse 102 is not carried out, the electric potential of the contacting target conductor region 108 becomes Vcc (high potential). Therefore, the input into the fourth inverter 142 becomes Vcc (high potential), and GND is inputted from the fourth inverter 142 into the NOR circuit 114.

According to the present embodiment, detection by the cut detecting circuit 110 and detection by the contact detecting circuit 112 can be carried out at the same time. That is, the first switch 130 and the second switch 140 can be turned on at the same time so as to carry out the above described detections.

The NOR circuit 114 outputs Vcc only when the input from the cut detecting circuit 110 and the input from the contact detecting circuit 112 are both GND, and otherwise, outputs GND. According to the present embodiment, the determination unit 115 may determine that the fuse 102 is in a cut state in the case where the output from the NOR circuit 114 is GND, and determine that the fuse 102 is not electrically disconnected and not in the cut state in the case where the output from the NOR circuit 114 is Vcc.

As described above, in the semiconductor device 100 according to the present embodiment, the accuracy for determining the cut state of the fuse 102 can be improved. Even if the semiconductor device 100 including the fuse 102 on which a process for cutting is carried out is used for a long period of time and both ends of the fuse 102 are short circuited, it can be determined that this fuse 102 is in the cut state when the connection between the fuse 102 and the contacting target conductor region 108 is detected, for example. Contrarily, even if the semiconductor device 100 including the fuse 102 on which a process for cutting is carried out is used for a long period of time and the connection between the fuse 102 and the contacting target conductor region 108 is opened, it can be determined that the fuse 102 is in the cut state when the disconnection of the fuse 102 is detected.

Next, a specific configuration of fuse 102 according to the present embodiment and the procedure for cutting the same are described. According to the present embodiment, the fuse 102 may be an electric fuse which can be cut by making a current flow through it. The present inventors found a technique for cutting an electric fuse by providing a certain configuration to an electric fuse and through control in accordance with a method for applying a voltage to an electric fuse in such a manner that the material constituting the electric fuse is forced to flow toward outside of the electric fuse, and thus, the balance between migration and the supply of the material is lost when the electric fuse is cut, thereby forming a larger cut portion in other part. That is, excessive power is applied to an electric fuse on which a process for cutting is to be carried out, and thus, a current flows through the electric fuse so that the conductive material is heated and expanded. When the conductive material expands, cracking occurs in the coating film surrounding the conductive material. Furthermore, the conductive material expands so that the conductive material is forced to flow toward outside through the cracks in the coating film surrounding the conductive material. As a result, the balance between migration and the supply of the conductive material is lost, and a large cut part is created at another portion than the region from which the conductive material has flown out. In the following, the cutting of the electric fuse in accordance with this technique is referred to as "crack assisted type cutting."

This crack assisted type cutting makes the cutting of an electric fuse easy and can maintain an excellent cut state. In addition, the configuration of the electric fuse can be modified so that portions where the conductive material flows out and the conductive material is cut can be selectively formed. According to the present embodiment, a process for cutting the fuse 102 is carried out using the crack assisted type cutting.

Figure 4A:
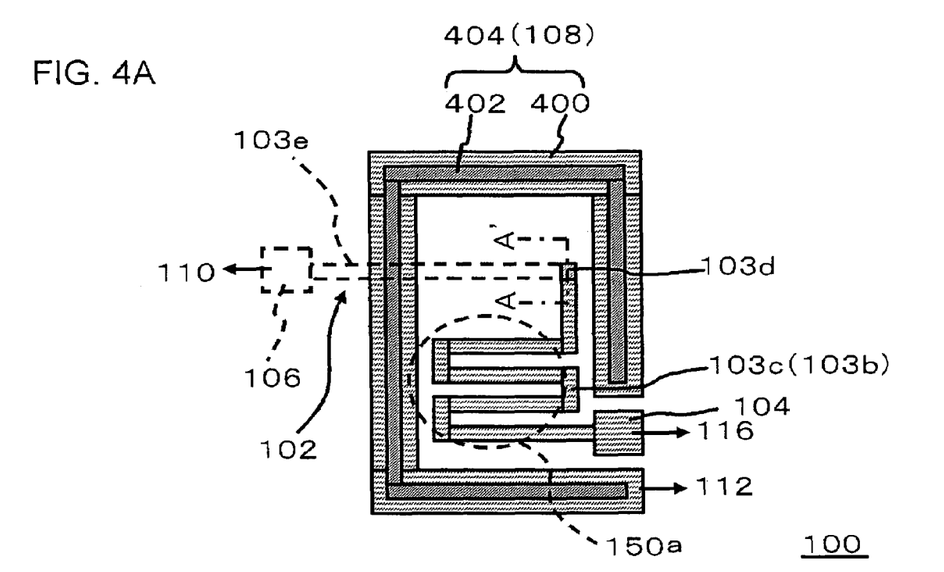
FIGS. 4A and 4B are top diagrams showing the specific configuration of a fuse according to an embodiment of the present invention.
Figure 4B:
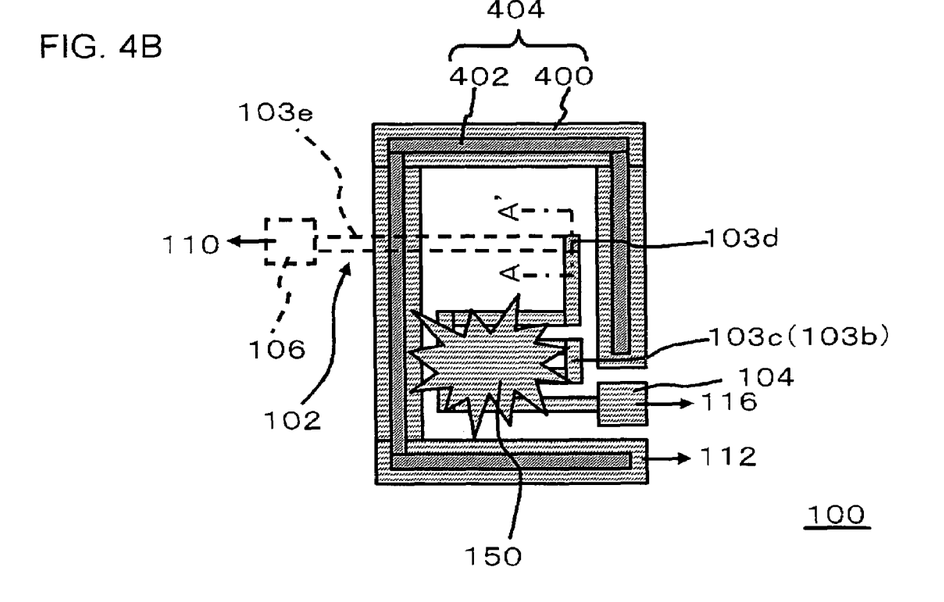

FIGS. 4A and 4B are top diagrams showing the configuration of a fuse 102 according to the present embodiment. The fuse 102 has a configuration where a contact portion 150 and a cut portion 152 are formed selectively, when a process for cutting is carried out. FIG. 4A shows a state before cutting, and FIG. 4B shows a state after cutting.

A semiconductor device 100 has a semiconductor substrate (not shown) and a fuse 102 formed on the semiconductor substrate. The fuse 102 is composed of a first interconnect 103c and a second interconnect 103e, which are formed in different layers, and a via 103d which connects the first interconnect 103c and the second interconnect 103e. Here, the first interconnect 103c is formed in the upper layer and the second interconnect 103e is formed in the lower layer. One end of the second interconnect 103e is connected to a second pad portion 106, and the other end is connected to the via 103d. One end of the first interconnect 103c is connected to the via 103d, and the other end is connected to the first pad portion 104. The first pad portion 104 is connected to a first terminal 116. The second pad portion 106 is connected to a cut detecting circuit 110.

The first interconnect 103c has a folded interconnect structure 103b. The folded interconnect structure 103b has a first straight line portion connected to the first pad portion 104, a second straight portion placed approximately parallel to the first straight line portion, a third straight line portion placed approximately parallel to the second straight line portion, a fourth straight line portion placed approximately parallel to the third straight line portion, a first connection portion which connects the first straight line portion and the second straight line portion, a second connection portion which connects the second straight line portion and the third straight line portion, a third connection portion which connects the third straight line portion and the fourth straight line portion, and a fourth connection portion which connects the fourth straight line portion and the via 103d.

In addition, according to the present embodiment, the semiconductor device 100 has a configuration where the top side, bottom side, and lateral sides of the fuse 102 are covered with a cover member 404. The cover member 404 is composed of a via 402, an electrode 400 and a plate which is not shown. The electrode 400 may be provided as a pad electrode which is formed in the same layer as the first interconnect 103c of the fuse 102. The via 402 is formed in an upper layer and a lower layer of the electrode 400, and connects the plates which are formed in further upper layer and a further lower layer, and the electrode 400 to each other. The via 402 may be provided as a slit via in a configuration where the via 402 and the electrode 400 can cover around the fuse 102 in wall form. As a result, heat generated in the fuse 102 when a current flows between the first pad portion 104 and the second pad portion 106 is reflected from the cover member 404 so as to be trapped inside the cover member 404. Thus, it becomes easy to form a contact portion 150 and a cut portion 152 in the fuse 102. In addition, the cover member 404 also functions as a diffusion preventing structure which prevents the material that constitutes the fuse 102 from diffusing or dispersing to the surroundings when the fuse 102 is cut. Therefore, the dispersed pieces of the material that constitutes the fuse 102 can be prevented from reaching other elements.

According to the present embodiment, the contacting target conductor region 108 can be formed of a cover member 404. The cover member 404 is placed so as to be electrically disconnected from the fuse 102 when the fuse 102 is in a state before cutting. In addition, the cover member 404 is placed in the vicinity of the folded interconnect structure 103b of the first interconnect 103c and formed so as to make contact with the first interconnect 103c of the fuse 102 via the contact portion 150 when a process for cutting is carried out on the fuse 102. Meanwhile, the cover member 404 is formed so as not to make contact with the second interconnect 103e even when a process for cutting is carried out on the fuse 102. Furthermore, the cover member 404 is connected to the contact detecting circuit 112.

The configuration of the cover member 404 is also described in the Japanese Unexamined Patent Publication 2005-57186 or the like. According to the present embodiment, a conventionally used cover member may be used as the contacting target conductor region 108, and thus, the accuracy for determining the state of the fuse 102 can be improved while preventing the increase of the area of the device.

When a current flows between the first pad portion 104 and the second pad portion 106 in the fuse 102 having the above described configuration, the material constituting the fuse 102 is heated. At this time, the conductive material is easily heated in portions where the interconnect is folded. Therefore, the conductive material easily thermally expands in the portion of the folded interconnect structure 103b, and cracking easily occurs. The material which constitutes the fuse 102 flows out from the folded interconnect structure 103b so as to form a contact portion 150. That is, according to the present embodiment, the portion of the folded interconnect structure 103b is an expected region of material flow-out 150a, where a contact portion 150 is to be formed.

When a material flows out from the expected region of the material flow-out 150a and a contact portion 150 is formed, the supply of the material does not keep up with the flow in the via 103d. Thus, via 103d tends to be cut easily. Therefore, the portion of the via 103d becomes an expected region to be cut, where the cut portion 152 is to be formed. In the fuse 102 according to the present embodiment, portions where the contact portion 150 and the cut portion 152 are formed can be selected.

Figure 5A:
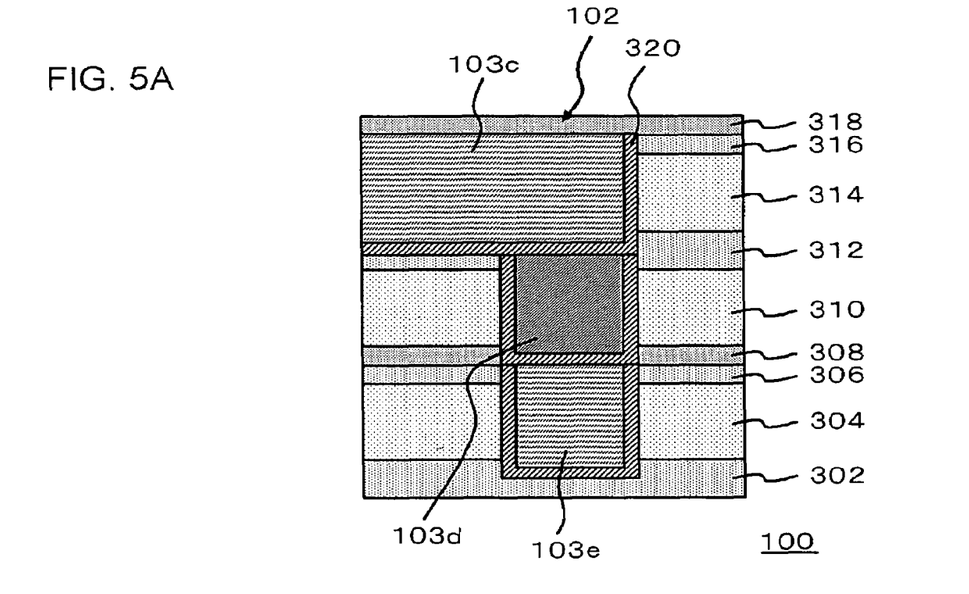
FIGS. 5A and 5B are cross sectional diagrams along line A-A' in FIGS. 4A and 4B.
Figure 5B:
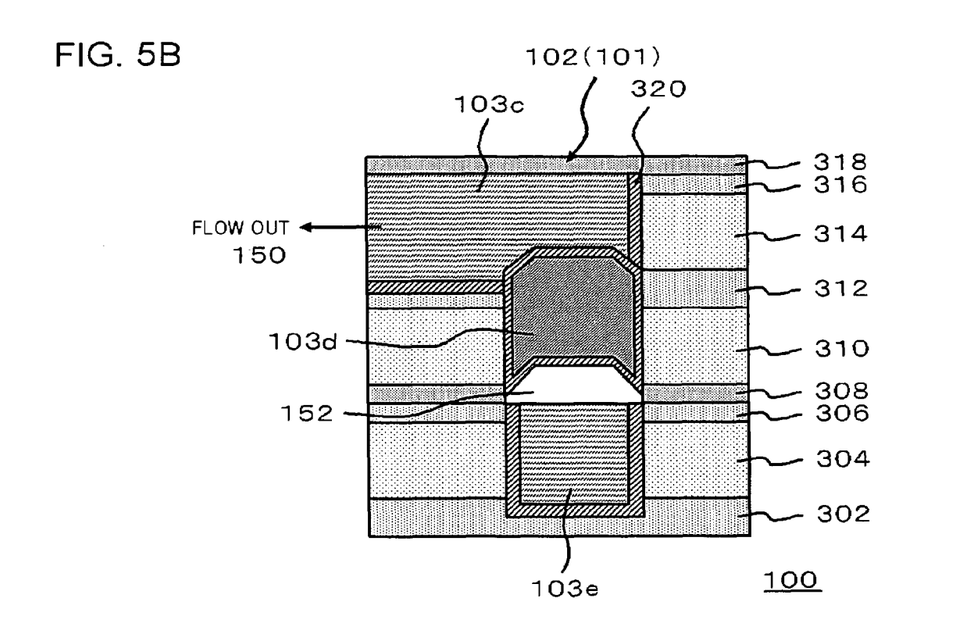

FIGS. 5A and 5B are cross sectional diagrams along line A-A' in FIGS. 4A and 4B showing an example of the fuse. FIG. 5A shows the state before cutting, and FIG. 5B shows the state after cutting. Here, though an example where the second interconnect 103e is a lower layer interconnect and the first interconnect 103c is an upper layer interconnect is shown, these may be the opposite.

As shown in FIG. 5A, the semiconductor device 100 includes a semiconductor substrate (not shown), and a first etch stop film 302, a first interlayer insulating film 304, a first protective film 306, a second etch stop film 308, a second interlayer insulating film 310, a third etch stop film 312, a third interlayer insulating film 314, a second protective film 316 and a fourth etch stop film 318, which are formed on the semiconductor substrate in this order.

The via 103d of the fuse 102 is electrically connected to the second interconnect 103e and the first interconnect 103c in the state before cutting. The second interconnect 103e is formed in the first etch stop film 302, the first interlayer insulating film 304 and the first protective film 306. The via 103d is formed in the second etch stop film 308, the second interlayer insulating film 310 and the third etch stop film 312. The first interconnect 103c is formed in the third etch stop film 312, the third interlayer insulating film 314 and the second protective film 316.

The second interconnect 103e, the via 103d and the first interconnect 103c may be composed of a copper containing metal film which includes copper as the main component. The copper containing metal film may include silver. Furthermore, the copper containing metal film may include one or more additional elements selected from among Al, Au, Pt, Cr, Mo, W, Mg, Be, Zn, Pd, Cd, Hg, Si, Zr, Ti and Sn. The copper containing metal film can be formed in accordance with, for example, a plating method. In addition, a silicide film, for example, may be formed on the surface of the copper containing metal film.

Furthermore, a barrier metal film 320 is formed on the sides and the bottom of the first interconnect 103c, the via 103d and the second interconnect 103e so as to make contact with and cover each of them. The barrier metal film may have a composition which contains metal of a high melting point. The barrier metal film 320 may be composed of, for example, Ta, TaN, Ti, TiN, W, WN or the like.

That is, a barrier metal film 320 is provided between the second interconnect 103e and the via 103d so as to make contact with these in the state before cutting. In addition, a barrier metal film 320 is also provided between the via 103d and the first interconnect 103c so as to make contact with them.

The first interlayer insulating film 304 and the third interlayer insulating film 314 may be composed of a low dielectric constant film, such as SiOC. In addition to SiOC, polyhydrogen siloxane such as HSQ (hydrogen silsesquioxane), MSQ (methyl silsesquioxane) or MHSQ (methylated hydrogen silsesquioxane), aromatic containing organic materials such as polyaryl ether (PAE), divinyl siloxane-bis-benzocyclobutene (BCS) or Silk®, SOG, FOX (flowable oxide), Cytop and BCB (benzocyclobutene) can be used as the low dielectric constant film. In addition, porous films theseof can also be used as the low dielectric constant film. The first interlayer insulating film 304 and the third interlayer insulating film 314 may be composed of the same material or different materials.

The second interlayer insulating film 310 may be composed of the same material as those described above for the first interlayer insulating film 304 and the third interlayer insulating film 314. Here, it is preferable that the second interlayer insulating film 310 is composed of a material that is harder than that of the first interlayer insulating film 304 and the third interlayer insulating film 314, in terms of the relation to the first interlayer insulating film 304 and the third interlayer insulating film 314. The second interlayer insulating film 310 may be composed of, for example, a material having higher Young's modulus than that of the first interlayer insulating film 304 and the third interlayer insulating film 314. This configuration makes it easy to form a contact portion 150 in an interconnect portion and form a cut portion 152 in the via 103d.

The second interlayer insulating film 310 in which the via 103d is formed, may be composed of, for example, SiOC (Black Diamond). The third interlayer insulating film 314 in which the first interconnect 103c may be formed, may be composed of SiOC (Aurora). Here, Black Diamond and Aurora are both porous films of SiOC. Aurora has lower relative dielectric constant, lower film density, and is more flexible film than Black Diamond.

Here, the invention is not limited to this configuration. The second interlayer insulating film 310 may be composed of the same material as the first interlayer insulating film 304 or the third interlayer insulating film 314. In this case also, the first interconnect 103c emits heat when a current is applied and expands a great deal, while the via 103d has a small conductive volume and the amount of the expansion due to heat conduction is small. Therefore, a cut portion 152 can be selectively formed in the via 103d.

The second etch stop film 308 and the fourth etch stop film 318 function as an etch stop film when via holes and interconnect trenches are formed, and have a function of preventing the copper that constitutes the second interconnect 103e and the first interconnect 103c from diffusing. The second etch stop film 308 and the fourth etch stop film 318 may be composed of a material which is harder than that of the first interlayer insulating film 304 and the third interlayer insulating film 314. The second etch stop film 308 and the fourth etch stop film 318 may be composed of a material having higher Young's modulus than that of the first interlayer insulating film 304 and the third interlayer insulating film 314. The second etch stop film 308 and the fourth etch stop film 318 may be composed of, for example, SiCN, SiN, SiC, SiOF or SiON.

The first protective film 306 and the second protective film 316 have a function of protecting the first interlayer insulating film 304 and the third interlayer insulating film 314 when the second interconnect 103e and the first interconnect 103c are respectively polished in accordance with CMP. The first protective film 306 and the second protective film 316 can be composed of, for example, an $SiO_2$ film.

The first etch stop film 302 and the third etch stop film 312 may be composed of a material which is the same as that for the second etch stop film 308 and the fourth etch stop film 318. In addition, though not shown here, the first etch stop film 302 and the third etch stop film 312 may be a multilayer film of a first insulating film composed of the same material as that for the second etch stop film 308 and the fourth etch stop film 318, and a second insulating film formed on top of the first insulating film and composed of the same material as that for the first protective film 306 and the second protective film 316.

Here, the second interconnect 103e, the via 103d and the first interconnect 103c having the above described configuration may be formed in accordance with the same process as that for conventional multilayer interconnect structures. As a result, the fuse 102 can be formed without adding any special process.

As described above, the surroundings of the first interconnect 103c, for example, are covered with coating films, such as a barrier metal film 320 and a fourth etch stop film 318, and further covered with the third interlayer insulating film 314 which is a more flexible material than the coating films, in the configuration.

When excessive power is applied to the fuse 102 having this configuration by applying a predetermined voltage between the first pad portion 104 and the second pad portion 106, the material which constitutes the first interconnect 103c expands in the direction toward the third interlayer insulating film 314, which is a flexible film. As the material expands, cracks are occurred in the barrier metal film 320 and the like, and the material that constitutes the first interconnect 103c flows out through the cracks and into the third interlayer insulating film 314. That is, the material that constitutes the first interconnect 103c flows out to the outside of the interconnect trench. Such a flow-out is occurred in the folded interconnect structure 103b of the first interconnect 103c. As a result, as shown in FIG. 4B, a contact portion 150 is formed. At this time, the contact portion 150 is connected to the cover member 404. Thus, the cover member 404 (contacting target conductor region 108) and the first terminal 116 are electrically connected.

Furthermore, the material that constitutes the fuse 102 suddenly moves in the direction toward the contact portion 150, and therefore, the material flow is cut in a portion where the material fails to keep up with the movement. According to the present embodiment, the material flow is cut and a cut portion 152 is formed at a portion of the via 103d. As a result of this mechanism, the contact portion 150 can be formed in a location at a distance from the cut portion 152.

In addition, according to the present embodiment, a barrier metal film 320 is provided between the via 103d and the second interconnect 103e, and therefore, the barrier metal film 320 easily peels from the second interconnect 103e. Thus, the cut portion 152 is easily formed between the barrier metal film 320 and the second interconnect 103e.

Furthermore, the material that constitutes the via 103d moves together with the barrier metal film 320, so that the cut portion 152 is formed between the barrier metal film 320 and the second interconnect 103e after cutting. Therefore, even when heat treatment or the like is carried out in a subsequent process, the barrier metal film 320 prevents the conductive material constituting the copper containing metal film from moving again and being reconnected to the second interconnect 103e. As a result, the heat resistance of the semiconductor device 100 can be improved. This is because the barrier metal film 320 is formed double between the contact portion 150 and the cut potion 152, and therefore, the move of the conductive material due to the heat treatment can be prevented.

Here, though a single damascene structure is shown as the interconnect structure in the above, a dual damascene structure may be provided.

In the semiconductor device 100 according to the present embodiment, as described above, the accuracy for determining whether or not the fuse 102 is in a cut state can be increased. In addition, the present embodiment provides a configuration wherein the electrical connection between the contacting target conductor region 108 and the fuse 102 is detected by grounding one end of the fuse 102. Therefore, when determining whether or not the fuse 102 and the contacting target conductor region 108 are electrically connected, the interconnect used for cutting the fuse 102 and determining whether the two ends of the fuse 102 are electrically disconnected can be used. Thus, a new interconnect for grounding is not required to be formed. Thus, the accuracy of determining the fuse 102 state can be improved with a simple configuration while preventing the increase of the area of the device. Furthermore, since the cover member 404 is used as the contacting target conductor region 108, there is no need to further form the contacting target conductor region 108. Thus, the accuracy of determining the fuse 102 state can be improved without increasing the area of the device.

Second Embodiment

Figure 6:
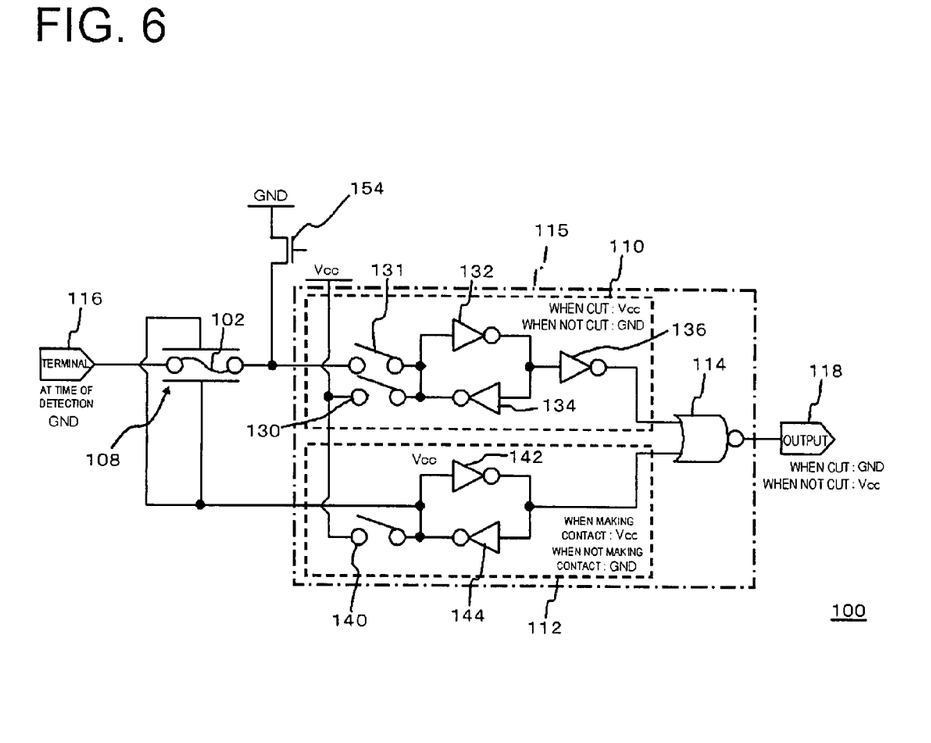
FIG. 6 is a schematic diagram showing the configuration of a semiconductor device according to an embodiment of the present invention.

FIG. 6 is a schematic diagram showing the configuration of a semiconductor device 100 according to the present embodiment.

According to the present embodiment, the process procedure for determining the cut state of a fuse 102 is different from the process procedure as described in the first embodiment.

The semiconductor device 100 further includes a transistor 154 of which either one of the source or the drain is connected to between the fuse 102 and a cut detecting circuit 110, in addition to the configuration as described in the first embodiment in reference to FIG. 2. Here, either the source or the drain of the transistor 154, whichever is not connected to between the fuse 102 and a cut detecting circuit 110, is grounded. Though not specifically described, a transistor which is included in a conventional fuse structure and used for cutting a fuse 102 can be used as the transistor 154. In addition, the cut detecting circuit 110 further includes a third switch 131 which turns on and off the connection between the fuse 102 and the first inverter 132, in addition to the configuration as described in the first embodiment in reference to FIG. 2.

The process procedure for determining whether the fuse 102 of the semiconductor device 100 having the above configuration is in a cut state or not is specifically described below. According to the present embodiment, detection by the cut detecting circuit 110 is carried out at timing different from that for detection by a contact detecting circuit 112.

First, the detection process by the cut detecting circuit 110 is explained.

A first switch 130 is turned on to connect a first inverter 132 and a power line Vcc, and at the same time, a third switch 131 is turned on to connect the first inverter 132 and the fuse 102. At this time, a second switch 140 and the transistor 154 are kept off. As a result, a predetermined electric potential (Vcc) is provided at one end of the fuse 102. In addition, the first terminal 116 is grounded (GND). After that, the first switch 130 is turned off, after a predetermined period of time has passed.

With this configuration, the determination of the state of electrical connection of the fuse 102 shows a similar result as in the first embodiment. That is, in the case where the fuse 102 is not electrically disconnected, GND is inputted from a third inverter 136 to an NOR circuit 114. Meanwhile, in the case where the fuse 102 is electrically connected, Vcc is inputted from the third inverter 136 into the NOR circuit 114.

Next, the detection process by the contact detecting circuit 112 is explained.

The first switch 130 and the third switch 131 are turned off. At this time, the first inverter 132 and the second inverter 134 in the cut detecting circuit 110 functions as a memory circuit, and therefore, the above detection results can be preserved. In this state, the second switch 140 is turned on, to connect the fourth inverter 142 and the power line Vcc. Thus, a predetermined electric potential (Vcc) is provided to a contacting target conductor region 108. In addition, a first terminal 116 is grounded (GND), and at the same time, the transistor 154 is turned on. As a result, one end and the other end of the fuse 102 are both grounded. After this, the second switch 140 is turned off, after a predetermined period of time has passed. Since one end and the other end of the fuse 102 are both grounded, the potential of the contacting target conductor region 108 can be set to be GND, irrespectively of the positional relationship between the contact portion and the cut portion of the fuse 102, in the case where a process for cutting the fuse 102 is carried out so that the fuse 102 makes electrical connection with the contacting target conductor region 108.

The detection of the state of electrical connection between the contacting target conductor region 108 and the fuse 102 in the above described state can show a similar result as in the first embodiment. That is, Vcc is inputted from the fourth inverter 142 into the NOR circuit 114, in the case where the contacting target conductor region 108 is electrically connected to the fuse 102. Meanwhile, GND is inputted from the fourth inverter 142 into the NOR circuit 114, in the case where the contacting target conductor region 108 is not electrically connected to the fuse 102.

According to the present embodiment, the NOR circuit 114 outputs Vcc only when the input from the cut detecting circuit 110 and the input from the contact detecting circuit 112 are both GND, and otherwise outputs GND, as described in the first embodiment. A determination unit 115 determines that the fuse 102 is in a cut state in the case where the output from the NOR circuit 114 is GND, and determines that the fuse 102 is not in a cut state in the case where the output from the NOR circuit 114 is Vcc.

Though in the present embodiment, the fuse 102 may have the same configuration as described in the first embodiment, the configuration of the fuse 102 is not particularly limited. Examples of the configuration of the fuse 102 are described below.

Figure 7A:
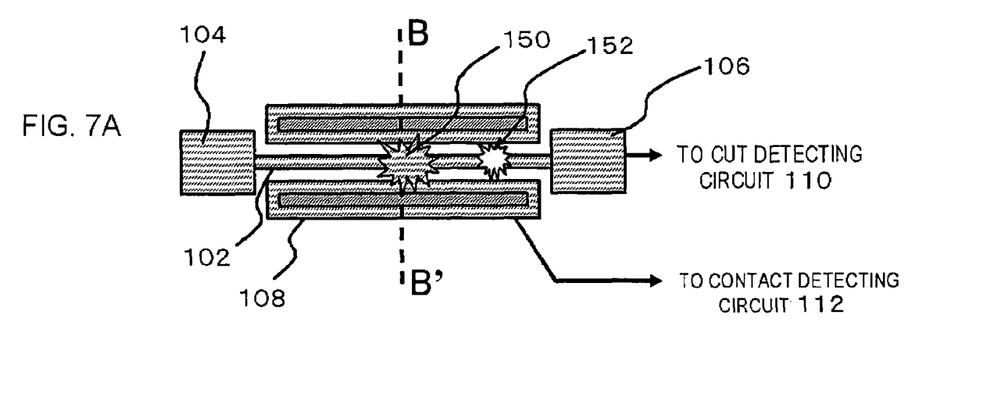
FIGS. 7A and 7B are diagrams showing the specific configuration of a fuse and a contacting target conductor.
Figure 7B:
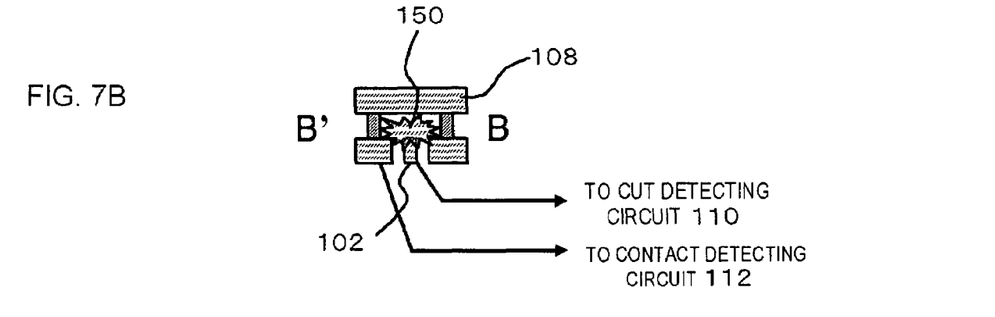

FIGS. 7A and 7B are diagrams showing the fuse 102 where the fuse 102 is an electric fuse. FIG. 7A is a top diagram, and FIG. 7B is a cross sectional diagram along B-B' in FIG. 7A.

The fuse 102 may be formed of an interconnect. A first pad portion 104 and a second pad portion 106 are formed at one end and at the other end of the fuse 102, respectively. Here, though the fuse 102 in a form extending in one direction is shown, the form of the fuse 102 may vary.

A contacting target conductor region 108 may be formed of a cover member which prevents the material that constitutes the fuse 102 from dispersing when the fuse 102 is cut, as the cover member 404 described in the first embodiment in reference to FIG. 4.

Figure 8A:
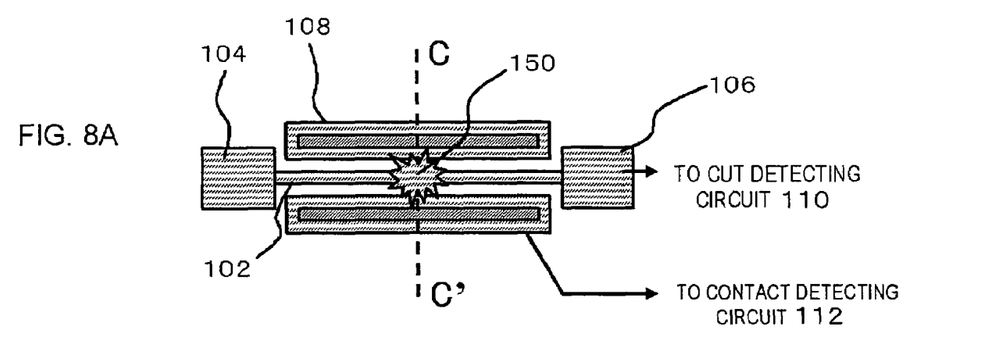
FIGS. 8A and 8B are diagrams showing the specific configuration of a fuse and a contacting target conductor.
Figure 8B:
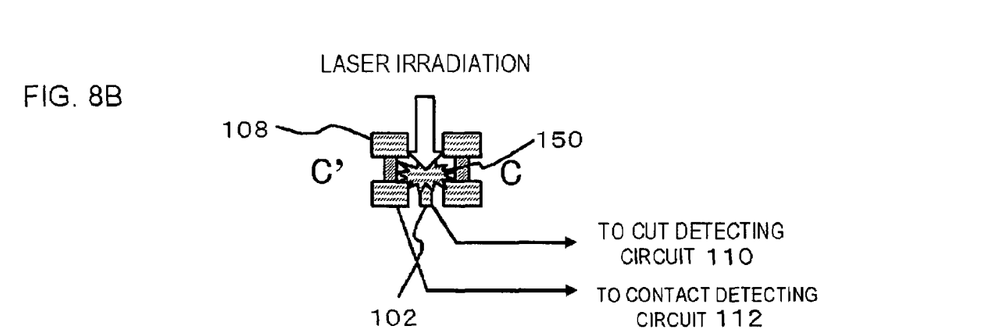

In addition, the fuse 102 may have such a configuration that it can be melt-cut by irradiating a laser, as shown in FIGS. 8A and 8B. FIG. 8A is a top diagram, and FIG. 8B is a cross sectional diagram along C-C' in FIG. 8A.

The same effects as those described in the first embodiment can be gained in the semiconductor device 100 according to the present embodiment. According to the present embodiment, the transistor used for cutting a fuse 102 can also be used as the transistor 154, and the accuracy of determining the fuse 102 state can be improved by a simple configuration while preventing the increase of the area of the device.

As described above, though the embodiments according to the present invention are described in reference to the drawings, these are illustrative of the present invention, and a variety of configurations can be adopted, in addition to that above.

According to the first embodiment, an example where the fuse 102 is formed of a first interconnect 103c, a via 103d and a second interconnect 103e in which the cut portion 152 is formed in the via 103d is described. However, other examples can be provided. For example, the fuse 102 may be a combination of a narrow interconnect and a folded interconnect structure 103b formed of a wide interconnect. In this case, a cut portion 152 may be formed in the narrow interconnect.

Figure 9:
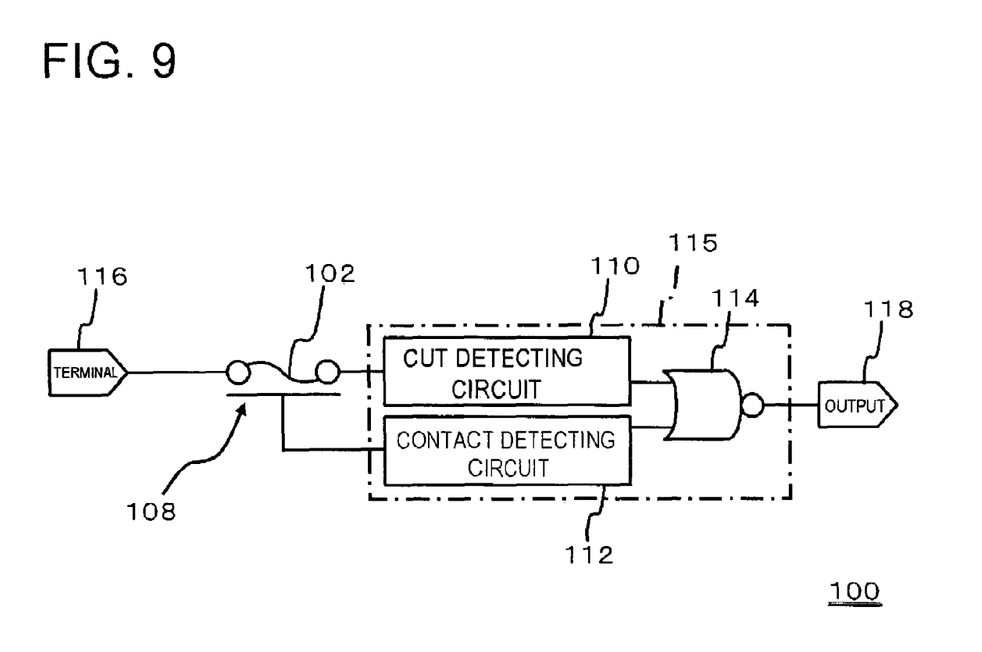
FIG. 9 is a schematic diagram showing the configuration of another semiconductor device according to an embodiment of the present invention.

Here, the above described embodiments show a configuration where a cover member 404 is used as a contacting target conductor region 108, and therefore, the contacting target conductor region 108 surrounds the entirety of the fuse 102 in the configurations shown in FIG. 1 and other figures. However, it is not necessary for the contacting target conductor region 108 to have such a configuration that surrounds the entirety of the fuse 102, and any configuration is possible, as long as the contacting target conductor region is arranged so as to make contact with the fuse 102 when a process for cutting the fuse 102 is carried out. FIG. 9 schematically shows such an example. In addition, the contacting target conductor region 108 may be provided separately from the cover member 404.

It is apparent that the present invention is not limited to the above embodiment, and may be modified and changed without departing from the scope and spirit of the invention.

What is claimed is:

1. A semiconductor device, comprising:
a semiconductor substrate;
a fuse which comprises a conductive material and is formed on said semiconductor substrate;
a contacting target conductor region which is placed around said fuse on said semiconductor substrate and formed so as to make electrical contact with the fuse through the conductive material constituting the fuse when a process for cutting the fuse is carried out; and
a determination unit which detects whether or not said fuse is electrically disconnected, as well as whether or not said contacting target conductor region and said fuse are electrically connected, and determines that said fuse is in a cut state when electrical disconnection of said fuse is detected or electrical connection between said contacting target conductor region and said fuse is detected,
wherein said contacting target conductor region is formed of a cover member which covers said fuse from above, below and the sides so as to prevent the conductive material constituting the fuse from diffusing into the surroundings when said fuse is cut.

2. The semiconductor device as set forth in claim 1, wherein
said determination unit includes: a first detection unit which is connected to one end of said fuse and detects whether or not the fuse is electrically disconnected; a second detection unit which is connected to said contacting target conductor region and detects whether or not said contacting target conductor region and said fuse are electrically connected; and an output unit into which an output from said first detecting unit and an output from said second detection unit are inputted, and which outputs a signal indicating that said fuse is in a cut state in the case where electrical disconnection of said fuse is detected by said first detection unit or in the case where electrical connection between said contacting target conductor region and said fuse is detected by said second detection unit.

3. The semiconductor device as set forth in claim 2, wherein
said first detection unit supplies a predetermined second electric potential to said one end of said fuse in a state where the other end of said fuse is grounded so as to detect whether said potential is high or low at said one end, and detects that said fuse is electrically disconnected in the case where said potential at said one end is high, and detects that said fuse is not electrically disconnected in the case where the potential is low at said one end.

4. The semiconductor device as set forth in claim 2, wherein
in said fuse, a cut portion is formed between said one end of the fuse and a connect portion which is connected to said contacting target conductor region in a cut state.

5. The semiconductor device as set forth in claim 2, wherein
said fuse includes a flow-out portion composed of said conductive material which has flown out from said fuse to be connected with said contacting target conductor region and to form a cut portion between said flow-out portion and said first detection unit in a cut state.

6. A semiconductor device comprising:
a semiconductor substrate;
a fuse which comprises a conductive material and is formed on said semiconductor substrate;
a contacting target conductor region which is placed around said fuse on said semiconductor substrate and formed so as to make electrical contact with the fuse through the conductive material constituting the fuse when a process for cutting the fuse is carried out; and
a determination unit which detects whether or not said fuse is electrically disconnected, as well as whether or not said contacting target conductor region and said fuse are electrically connected, and determines that said fuse is in a cut state when electrical disconnection of said fuse is detected or electrical connection between said contacting target conductor region and said fuse is detected,
wherein said determination unit includes:
a first detection unit which is connected to one end of said fuse and detects whether or not the fuse is electrically disconnected;
a second detection unit which is connected to said contacting target conductor region and detects whether or not said contacting target conductor region and said fuse are electrically connected; and
an output unit into which an output from said first detecting unit and an output from said second detection unit are inputted, and which outputs a signal indicating that said fuse is in a cut state in the case where electrical disconnection of said fuse is detected by said first detection unit or in the case where electrical connection between said contacting target conductor region and said fuse is detected by said second detection unit, and
wherein said second detection unit supplies a predetermined first electric potential to said contacting target conductor region in a state where said fuse is grounded so as to detect whether an electric potential at said contacting target conductor region is high or low, and detects that said contacting target conductor region and said fuse are not electrically connected in the case where said potential at said contacting target conductor region is high, and detects that said contacting target conductor region and said fuse are electrically connected in the case where said electric potential at said contacting target conductor region is low.

7. A method for determining a fuse state in a semiconductor device comprising a fuse which includes a conductive material and is formed on a semiconductor substrate and a contacting target conductor region which is placed around said fuse on said semiconductor substrate and formed so as to be electrically connected to said fuse through the conductive material constituting said fuse when a process for cutting said fuse is carried out, the method for determining said fuse state, comprising:

detecting whether or not said fuse is electrically disconnected;

detecting whether or not said contacting target conductor region and said fuse are electrically connected; and determining that said fuse is in a cut state when electrical disconnection of said fuse is detected or electrical connection between said contacting target conductor region and said fuse is detected, wherein in said detecting whether or not said contacting target conductor region and said fuse are electrically connected, a predetermined electric potential is supplied to said contacting target conductor region and it is detected whether an electric potential at the contacting target conductor region is high or low in a state where said fuse is grounded, and in the case where said electric potential is low at the contacting target conductor region, electrical connection between said contacting target conductor region and said fuse is detected, and in the case where said electric potential at the contacting target conductor region is high, electrical disconnection between said contacting target conductor region and said fuse is detected.

8. The method for determining a fuse state as set forth in claim 7, wherein in said detecting whether or not said fuse is electrically disconnected, a predetermined electric potential is supplied to the other end side of said fuse, and it is detected whether an electric potential on said other end side of said fuse is high or low in a state where one end side of said fuse is grounded, and in the case where said electric potential on said other end side of said fuse is high, electrical disconnection of said fuse is detected, and in the case where said electric potential on said other end side of said fuse is low, electrical connection of said fuse is detected.

9. The method for determining a fuse state as set forth in claim 7, wherein said fuse is formed so as to be electrically connected to said contacting target conductor region on one end side of the fuse when a process for cutting the fuse is carried out, said detecting whether or not said fuse is electrically disconnected and said detecting whether or not said contacting target conductor region and said fuse are electrically connected are carried out approximately simultaneously, in said detecting whether or not said fuse is electrically disconnected, a predetermined electric potential is supplied to the other end side of said fuse, and it is detected whether an electric potential on said other end side of said fuse is high or low in a state where said one end side of said fuse is ground, and in the case where said electric potential is high on said other end side of said fuse, electrical disconnection of said fuse is detected, and in the case where said electric potential is low on said other end side of said fuse, electrical connection of said fuse is detected, and in said detecting whether or not said contacting target conductor region and said fuse are electrically connected, a predetermined electric potential is provided to said contacting target conductor, and it is detected whether an electric potential at the contacting target conductor region is high or low, and in the case where said electric potential at the contacting target conductor region is low, electrical connection between said contacting target conductor region and said fuse is detected, and in the case where said electric potential is high at the contacting target conductor region, electrical disconnection between said contacting target conductor region and said fuse is detected.

10. The method for determining a fuse state as set forth in claim 7, wherein said detecting whether or not said fuse is electrically disconnected and said detecting whether or not said contacting target conductor region and said fuse are electrically connected are carried out in sequence, in said detecting whether or not said fuse is electrically disconnected, a predetermined electric potential is supplied to the other end side of said fuse, and it is detected whether or not the electric potential on said other end side of said fuse is high or low in a state where one end side of said fuse is grounded, and in the case where said electric potential is high on said other end side of said fuse, electrical disconnection of said fuse is detected, and in the case where said electric potential is low on said other end side of said fuse, electrical connection of said fuse is detected, and in said detecting whether or not said contacting target conductor region and said fuse are electrically connected, a predetermined electric potential is supplied to said contacting target conductor region in a state where said one end side and said other end side of said fuse are grounded, and it is detected whether said electric potential at the contacting target conductor region is high or low, and in the case where said electric potential is low at the contacting target conductor region, electrical connection between said contacting target conductor region and said fuse is detected, and in the case where the electric potential is high at the contacting target conductor region, electrical disconnection between said contacting target conductor region and said fuse is detected.

* * * * *